United States Patent
Fogal et al.

[11] Patent Number: 6,133,630
[45] Date of Patent: *Oct. 17, 2000

[54] CONDENSED MEMORY MATRIX

[75] Inventors: Rich Fogal; Alan G. Wood, both of Boise, Id.

[73] Assignee: Micron Technology, Inc., Boise, Id.

[ * ] Notice: This patent is subject to a terminal disclaimer.

[21] Appl. No.: 09/287,460

[22] Filed: Apr. 7, 1999

Related U.S. Application Data

[60] Continuation of application No. 08/909,401, Aug. 11, 1997, Pat. No. 5,905,305, which is a division of application No. 08/590,775, Jan. 24, 1996, Pat. No. 5,977,629.

[51] Int. Cl.[7] .......................... H01L 23/34; H01L 23/10; H01L 23/48
[52] U.S. Cl. .......................... 257/712; 257/706; 257/722; 257/783; 257/707; 257/778
[58] Field of Search .................. 257/712, 706, 257/722, 783, 737, 707, 778

[56] References Cited

U.S. PATENT DOCUMENTS

| | | | |
|---|---|---|---|
| 4,190,855 | 2/1980 | Inoue | 257/778 |
| 4,604,644 | 8/1986 | Beckham et al. | 257/713 |
| 5,138,434 | 8/1992 | Wood et al. | 257/727 |
| 5,182,632 | 1/1993 | Bechtel et al. | 257/713 |
| 5,214,657 | 5/1993 | Farnworth et al. | 371/40.1 |
| 5,229,647 | 7/1993 | Gnadinger | 257/785 |
| 5,249,101 | 9/1993 | Frey et al. | 257/738 |
| 5,629,630 | 5/1997 | Thompson et al. | |
| 5,685,885 | 11/1997 | Khandros et al. | |
| 5,704,116 | 1/1998 | Gamota et al. | 29/840 |
| 5,785,799 | 7/1998 | Culnane et al. | 257/707 |
| 5,789,271 | 8/1998 | Akram | 438/18 |
| 5,824,177 | 10/1998 | Yoshihara et al. | |
| 5,886,408 | 3/1999 | Ohki et al. | 257/720 |
| 5,905,305 | 5/1999 | Fogal et al. | 257/712 |
| 5,977,629 | 11/1999 | Fogal et al. | 257/712 |

FOREIGN PATENT DOCUMENTS 3-225934   4/1991   Japan ..................... 257/785

OTHER PUBLICATIONS

Herbert Stopper, "Wafer–Scale Integration", pp. 354–364.
"Electronic Packaging and Interconnection Handbook", Chapter 7, pp. 7.24–7.27.

*Primary Examiner*—David Hardy
*Assistant Examiner*—Jhihan B Clark
*Attorney, Agent, or Firm*—Trask Britt

[57] ABSTRACT

A condensed memory matrix is fabricated by conductively connecting the attachment bumps of a substrate with the attachment bumps of a wafer of DRAM chips and physically bonding the juxtaposed surfaces of the substrate and the wafer with a dielectric curable resin. An array of heat fins is bonded to the inactive surface of the wafer by a thermally conductive curable resin.

12 Claims, 2 Drawing Sheets

CONDENSED MEMORY MATRIX

CROSS REFERENCE TO RELATED APPLICATION

This application is a continuation of application Ser. No. 08/909,401, filed Aug. 11, 1997, now U.S. Pat. No. 5,905,305, which is a divisional of application Ser. No. 08/590,775, filed Jan. 24, 1996, now U.S. Pat. No. 5,977,629.

BACKGROUND OF THE INVENTION

1. Field of the Invention

This invention pertains to wafer-scale integration (WSI) and, more particularly, to memory devices. It is specifically directed to a condensed memory matrix (CMM) having application to memory modules, memory cards, hard drives and the like.

2. State of the Art

Wafer-scale integration (WSI) refers generally to a method for maintaining functionally defined and independently testable "chips" (or dies) on a wafer. WSI has always been understood as a method of fabrication rather than a size of fabrication. Currently, while wafers are routinely constructed as discs up to nine (9) inches, more typically, wafers are produced being seven (7) inches in diameter, although the wafer size may vary as manufacturing capabilities vary. Conventionally, selected "good" chips are interconnected through wiring deposited on the wafer, rather than dicing the wafer and interconnecting individual chips by means of single chip packaging or other expedients. Portions of the disc, carrying a requisite number of dies, may be cut from the wafer for use in the construction of a device. The primary goal of WSI has been to increase system density beyond that achievable by maximizing chip size within an ordinary packaging environment. It is also generally understood that increasing density improves system performance and decreases system cost.

To realize increased density, good chip yield on the wafer must be very high. Otherwise, dilution of good chips with bad chips on the wafer will work against density gain. All of the chips on a wafer must ordinarily be fabricated from the same process for the wafer to be competitive, on either an economic or performance basis, with independently produced single chips. This is understood as meaning that all chips on a wafer must be of the same type (no mixing of DRAM, SRAM, Logic, EPROM, etc. on the same wafer). Wafers with only DRAM chips, especially DRAM chips of small size, find practical application in the construction of a memory.

U.S. Pat. No. 5,214,657 discloses a method for utilizing the good portions of an otherwise defective WSI wafer. Specifically, circuitry is provided to enable dicing of the wafer to salvage discrete memory sections should the wafer as a whole fail testing. Fuses in the wiring laid down on the wafer may selectively be blown to isolate defective dies from the circuits interconnecting the good dies.

Hybrid WSI (HWSI) has been suggested to avoid some of the practical limitations of WSI. HWSI involves mounting tested good chips of any type on a tested good wafer. The wafer provides passive chip interconnections, power distribution and intermediate cooling. The HWSI approach forgoes the economical benefits of conventional WSI and has the disadvantage of making cooling more difficult since the glue required to bond the chips to the wafer causes an additional temperature drop in the cooling path.

There remains a need in the art for further refinements in WSI technology whereby a wafer or a portion of a wafer may be connected to a substrate material, such as a substrate circuit board (SCB). Such a construction would increase system density in a memory device and would provide practical portability for such devices at low cost.

SUMMARY OF THE INVENTION

This invention may be viewed as an improvement in the fabrication of an electronic memory device including a plurality of dies (typically DRAM dies), carried by a wafer and connected through attachment bumps in circuit with wires carried by a substrate. In general, the improvement of the present invention comprises: providing a wafer with a first array of attachment bumps arranged in a first pattern; providing a substrate with a second array of attachment bumps arranged in a second pattern, the second pattern being the approximate mirror image of the first pattern; juxtaposing the first and second arrays of attachment bumps in mutually conductive relationship; and bonding the wafer to the substrate with a dielectric adhesive material. The present invention further includes the bonding of a heat dissipation device to the wafer using a thermally conductive adhesive material.

According to one embodiment of the invention, a condensed memory matrix (CMM) is fabricated by conductively connecting the attachment bumps of a substrate with the attachment bumps of a wafer of chips (e.g., DRAM chips) and physically bonding the juxtaposed surfaces of the substrate and the wafer using a curable dielectric resin. The attachment bumps of the substrate need not be identical to, but must be complementary with (e.g. bondable to), the attachment bumps of the wafer. An array of heat fins is bonded to the inactive surface of the wafer using a thermally conductive curable resin. The materials and techniques useful for the fabrication of integrated circuit (IC) devices generally are acceptable for the fabrication of the condensed memory matrices of this invention. Dies of conventional dimension and properties are currently of greatest interest.

This invention provides for increased memory in the space available in modules or cards. It also offers increased storage capacity for hard drive units and for thinner package capability generally. The close proximity of dies in the memory matrix of this invention provides for increased operating speed to the devices incorporating portions of the matrix.

Physically, the condensed memory matrix structures of this invention comprise a conventional substrate, e.g., of silicone, ceramic, poly PCB or flex PCB material. A pattern or array of circuit connection structures, such as gold ball bumps, lead solder bumps or curable types (by air or heat) of attachment bumps, is carried on a first or "active" surface of the substrate in conventional fashion. A layer of low stress dielectric material, preferably a cured resin with adhesive properties, fills the interstices between the circuit connection structures. A wafer with a plurality of dies is mounted against the dielectric layer. A first or "active" surface of the wafer carries die connection structures, such as bumps, juxtaposed against and in conductive relationship as by fusing through a reflow type or curing process, with corresponding circuit connection structures carried by the substrate. The dielectric layer also fills the interstices between the die connection structures. A thermally conductive layer, such as an epoxy resin, bonds a heat dissipation device, such as an array of suitable type heat fins, to a second surface of the wafer opposite the first surface (carrying the die connection structures.)

A novel, condensed memory matrix of this invention is fabricated by connecting a conventional wafer, a conventional substrate and a conventional heat dissipation device through generally the following sequence of steps:

1. Provide solder bumps for all appropriate bonding pads on a wafer.
2. Provide solder bumps at all appropriate locations on a substrate circuit board (SCB).
3. Dispense a non-conductive, low stress adhesive coating (such as an epoxy-based liquid polymeric adhesive) onto all appropriate locations on the SCB.
4. Align the wafer using conventional flip chip bonding technology, with respect to the SCB such that the respective bumps of each are in approximate registration; e.g., a wafer may be positioned above an SCB with each bump bonded to the wafer's bonding pad located directly above a corresponding solder bump carried by the SCB.
5. Press the bumps of the wafer against those of the SCB, as by lowering the wafer onto the SCB with their respective bumps juxtaposed to each other. This step should preferably be conducted before the adhesive applied in step 3 is fully cured.
6. Allow the adhesive to cure. The solder bumps are then reflowed in conjunction with the epoxy through appropriate, well known conventional processes, thereby fusing juxtaposed bumps together. The dies carried by the wafer, and thus the wafer, are thereby mechanically connected to the SCB.
7. Apply a thermally conductive layer, typically an uncured epoxy-based material, across the non-circuit surface or bottom of the wafer.
8. Attach a heat sink structure to the thermally conductive layer. For example, a suitable type heat sink fin may be pressed onto the top of an uncured epoxy resin layer and held in position until that layer cures.

The thus-fabricated condensed memory matrix (CMM) is suitable for use as a hard drive unit with 800M or more memory storage capacity. It may also be used as a supply source for smaller segments of condensed memory structure. For example, portions containing one or several dies may be cut from the matrix and packaged. The wafer may be mapped to identify those dies which test "good." Only those dies need to be bumped, and the "known good die" (KGD) portions of the wafer may be separated, either before or following the matrix fabrication process. Product specific memory card outlines may be incorporated into a section of the matrix during fabrication.

BRIEF DESCRIPTION OF THE SEVERAL VIEWS OF THE DRAWINGS

The drawings, which illustrate what is currently regarded as the best mode for carrying out the invention, will be understood when taken in conjunction with the specification wherein.

DETAILED DESCRIPTION OF THE INVENTION

Figure 1:
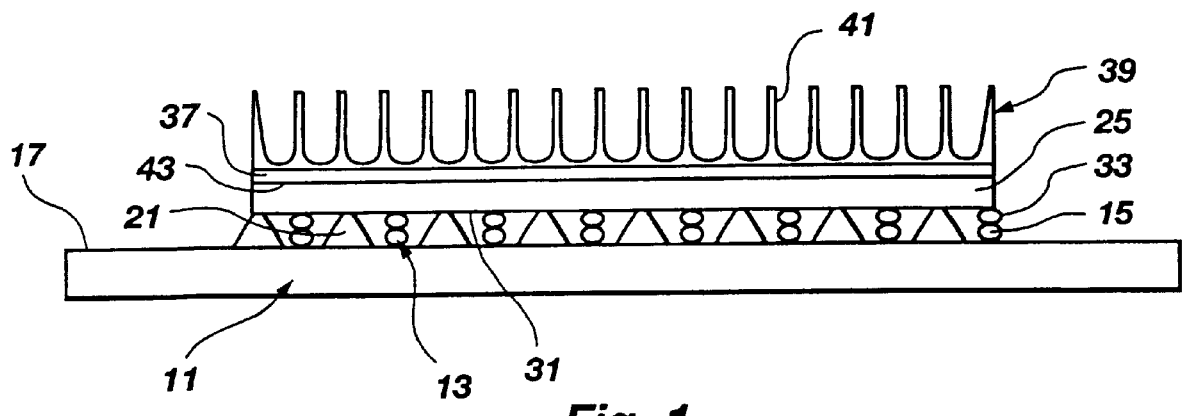
FIG. 1 is a view in elevation of a typical condensed memory matrix of this invention.
Figure 2:
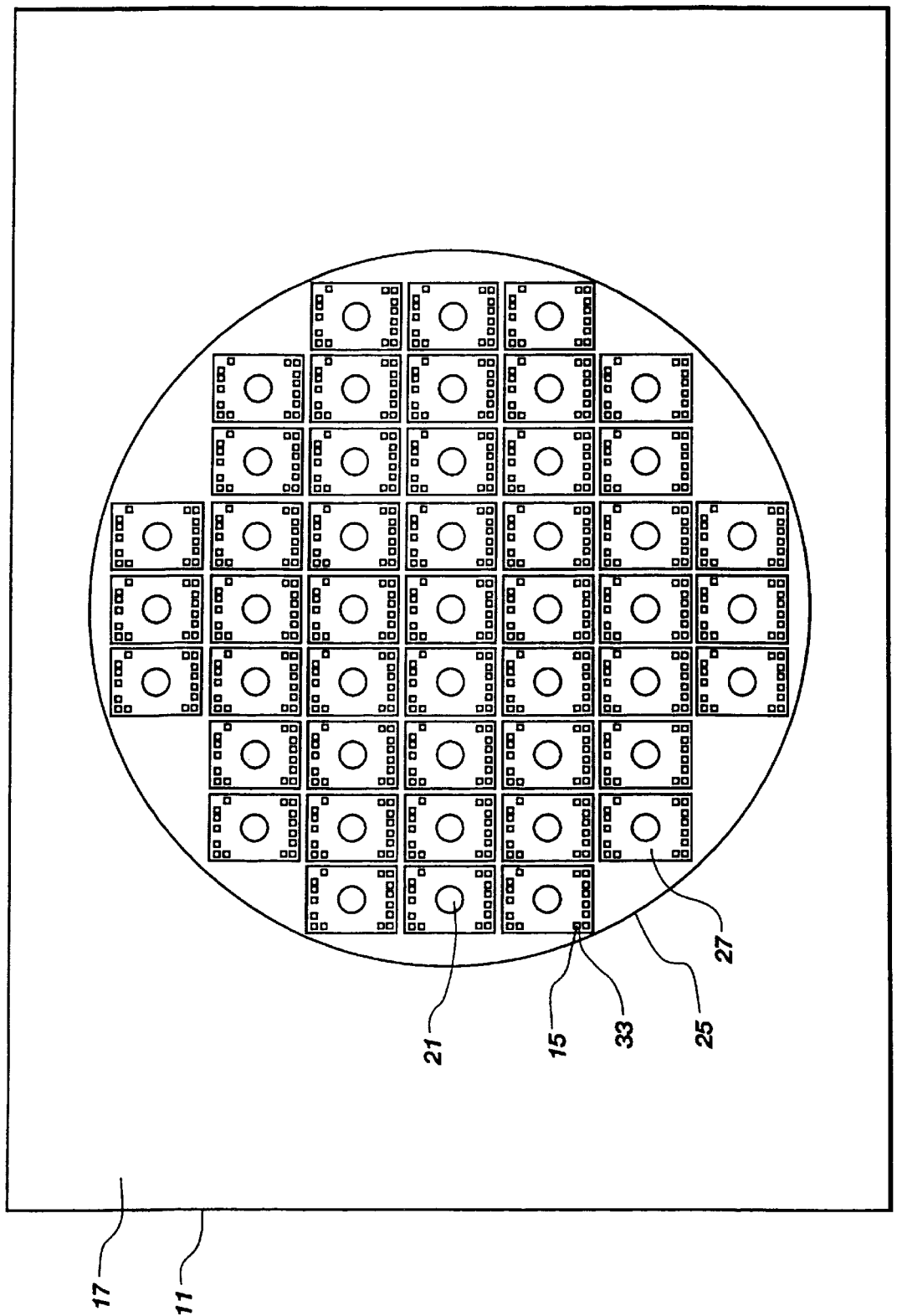
FIG. 2 is a plan view of a wafer and PCB oriented for connection in accordance with this invention, dies and bumps being shown in phantom.

A condensed memory matrix structure of this invention, as illustrated by FIGS. 1 and 2, comprises a conventional poly PCB substrate 11. An array, generally 13, of lead solder bumps 15, is carried on an active surface 17 of the substrate 11 in a conventional pattern. A layer 21 of low stress dielectric epoxy-based resin is applied to the active surface 17. A wafer, generally 25, carrying a plurality of memory (DRAM) dies 27 is mounted against the dielectric layer 21. An active surface 31 of the wafer 25 carries water bumps 33 of any desired suitable material, such as gold, gold alloy, lead solder, etc., juxtaposed against corresponding solder bumps 15 of any desired suitable material carried by the substrate 11. The dielectric layer 21 fills the interstices between individual substrate solder bumps 15 and corresponding individual wafer bumps 33. A thermally conductive layer 37 of epoxy-based thermally conductive resin bonds an array, generally 39, of metallic heat fins 41 to the inactive surface 43 of the wafer 25.

Figure 3:
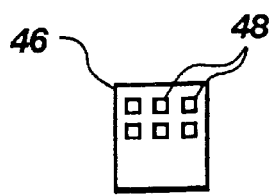
FIGS. 3–5 are diagrammatic plan views of typical product applications of this invention.

FIG. 3 illustrates a thin, small outline plastic package 46 (TSOP), which contains a plurality of condensed memory matrix 48 located thereon fabricated according to the present invention to form the desired memory to be used in an appropriate, suitable device.

Figure 4:
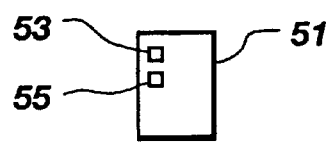

FIG. 4 illustrates a known good die (KGD) segment of a wafer 51 containing two dies, 53, 55 tested to be "good." This segment may be bumped and utilized in the fabrication of a condensed memory device.

Figure 5:
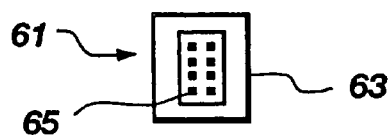

FIG. 5 illustrates a typical product specific condensed memory matrix (CMM), generally 61, fabricated in accordance with this invention. The CMM is configured as a memory card 63 carrying the amount of memory matrix 65 required for a personal computer (PC) application. This card can be installed to function, for example, as a hard drive of a PC. The memory card 63 can be portable, i.e., physically removed from a first PC, and installed in a second PC, thereby physically transporting the stored memory without the need for network transmission or auxiliary disc drive devices.

Reference in this specification to specific details of preferred or illustrated embodiments is not intended to restrict the scope of the appended claims, which themselves recite those details regarded as important to the invention.

What is claimed is:

1. A condensed memory matrix, comprising:
    a substrate;
    an array of circuit connection structures, carried on a surface of said substrate;
    a layer of dielectric material, filling the interstices between said circuit connection structures;
    a wafer, with a plurality of dies, mounted against said dielectric layer, a surface of said wafer carrying die connection structures juxtaposed against and in conductive relationship with corresponding said circuit connection structures carried by said substrate such that said dielectric layer also fills the interstices between said die connection structures;
    a layer, on a portion of said surface of said wafer opposite said surface carrying said die connection structures; and
    a heat dissipation device connected to a portion of said layer.

2. A condensed memory matrix according to claim 1, wherein said circuit connection structures are first attachment bumps and said die connection structures are second attachment bumps complementary to said first attachment bumps.

3. A condensed memory matrix according to claim 1, wherein said dielectric material layer includes a low stress, epoxy-based curable resin which bonds said substrate to said wafer.

4. A condensed memory matrix according to claim 1, wherein said plurality of dies include DRAM dies.

5. A condensed memory matrix according to claim 1, wherein said dielectric material layer comprises an epoxy-based resin which bonds said wafer to said heat dissipation device.

6. A condensed memory matrix according to claim 1, wherein said heat dissipation device includes a metallic device having at least one heat fin located thereon.

7. A condensed memory matrix according to claim 1, wherein:

said circuit connection structures are first attachment bumps and said die connection structures are second attachment bumps substantially complementary to said first attachment bumps;

said dielectric material layer comprises a low stress, epoxy-based curable resin which bonds said substrate to said wafer; and said dielectric material layer comprises an epoxy-based resin which bonds said wafer to said heat dissipation device.

8. A condensed memory matrix according to claim 1, wherein said dielectric material layer comprises a thermally conductive layer.

9. A condensed memory matrix according to claim 1, wherein said dielectric material layer comprises a non-conductive layer.

10. A condensed memory matrix according to claim 1, wherein said dielectric material layer comprises an electrically conductive layer.

11. A condensed memory matrix according to claim 7, wherein said plurality of dies comprise DRAM dies.

12. A condensed memory matrix according to claim 7, wherein said heat dissipation device includes a metallic device having a portion thereof configured having at least one heat fin.

* * * * *

UNITED STATES PATENT AND TRADEMARK OFFICE
CERTIFICATE OF CORRECTION

PATENT NO. : 6,133,630
DATED : October 17, 2000
INVENTOR(S) : Fogal, et al.

It is certified that error appears in the above-identified patent and that said Letters Patent is hereby corrected as shown below:

Title page,
Second column, name of Assistant Examiner, change "Jhihan B Clark" to
-- Jhihan B. Clark --

Column 1,
Line 3, change "CROSS REFERENCE" to -- CROSS-REFERENCE --;
Line 61, change "for-" to -- fore --;

Column 2,
Line 65, change "structures.)" to -- structures). --;

Column 3,
Line 2, after "through" and "generally" insert -- , --;
Line 10, change "flip chip" to -- flip-chip --;
Line 24, change "well known" to -- well-known --;

Column 4,
Line 7, change "water" to -- wafer --; and
Line 26, change "product specific" to -- product-specific --.

Column 4, claim 1,
Line 46, delete "the";
Line 49, after "dielectric" insert -- material --;
Line 53, after "dielectric" insert -- material --;
Line 55, after "layer" delete ",";
Line 58, after "said" insert -- dielectric material --;

Column 4, claim 2,
Line 60, change "A" to -- The --;

Column 4, claim 3,
Line 65, change "A" to -- The --;

Column 5, claim 4,
Line 1, change "A" to -- The --;
Line 2, change "include" to -- includes --;

Column 5, claim 5,
Line 3, change "A" to -- The --;

UNITED STATES PATENT AND TRADEMARK OFFICE
CERTIFICATE OF CORRECTION

PATENT NO. : 6,133,630
DATED : October 17, 2000
INVENTOR(S) : Fogal, et al.

It is certified that error appears in the above-identified patent and that said Letters Patent is hereby corrected as shown below:

Column 5, claim 6,
Line 7, change "A" to -- The --;

Column 5, claim 7,
Line 10, change "A" to -- The --;

Column 6, claim 8,
Line 4, change "A" to -- The --;

Column 6, claim 9,
Line 7, change "A" to -- The --;

Column 6, claim 10,
Line 10, change "A" to -- The --;

Column 6, claim 11,
Line 13, change "A" to -- The --;

Column 6, claim 11,
Line 14, change "comprise" to -- comprises --; and

Column 6, claim 12,
Line 15, change "A" to -- The --.

Signed and Sealed this

Thirteenth Day of November, 2001

*Attest:*

*Attesting Officer*

NICHOLAS P. GODICI
*Acting Director of the United States Patent and Trademark Office*